ARRANGEMENT FOR GENERATING ELECTROMAGNETIC RADIATION
Filed Dec. 10, 1964
Fig.1
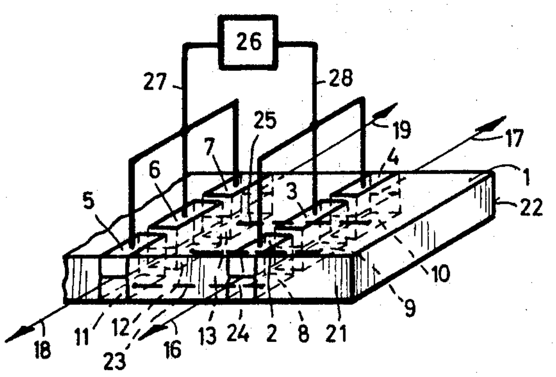
Fig.2
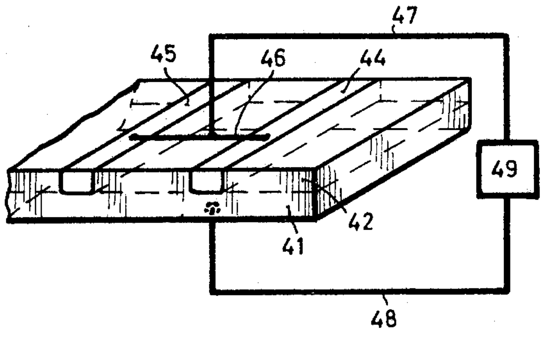
Fig.3
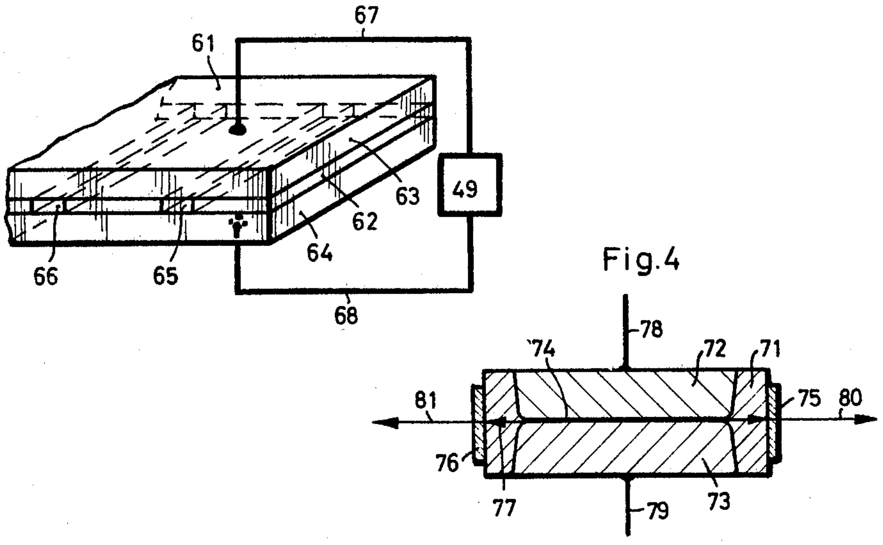
Fig.4

United States Patent Office 3,510,795
Patented May 5, 1970

3,510,795

ARRANGEMENT FOR GENERATING ELECTROMAGNETIC RADIATION

Günter Winstel, Munich, Germany, assignor to Siemens & Halske Aktiengesellschaft, Berlin, Germany and Munich, Germany, a corporation Filed Dec. 10, 1964, Ser. No. 417,456
Claims priority, application Germany, Dec. 13, 1963, S 88,709
Int. Cl. H01s *3/18*
U.S. Cl. 331—94.5 19 Claims

ABSTRACT OF THE DISCLOSURE

To provide an integral heat sink in a laser diode having an extended laser active pn junction area, a material merely intrinsically conducting or of high resistivity is structurally continuous with a substantial lateral extent of the p- and n-conductive junction-forming regions, at least up to the junction; and deposited metallic end mirrors extending across the plane of a junction are rendered feasible. Laser diode bodies integrally incorporating one or several coplanar active junctions, with various extents of such integral heat sinks, are fabricated by disclosed methods utilizing known doping and/or epitaxial deposition techniques.

This invention relates generally to an arrangement for generating and/or amplifying electromagnetic radiation and, more specifically, to a semiconducting body having a pn-junction effective for emitting radiation in accordance with the laser principle, and in which the thermal load is closely controlled.

It has already been demonstrated that a semiconductor diode can be used to generate electromagnetic radiation, particularly in the frequency range of visible light. Such diodes are frequently referred to as luminescence diodes. Those operating in accordance with the laser principle are usually referred to as laser diodes. These devices are produced by doping a p- or n-semiconducting material with a material producing in some part thereof an n- and p-type conduction, respectively, thus creating a pn-junction. In the junction area, the current injected charge carriers are for a certain time in an energy state above the ground state. From this excited state, radiative transitions to lower energy levels occur.

A problem associated with devices of this type, and still until now awaiting a satisfactory solution, is the control of thermal load conditions in the semiconducting material. These problems are particularly serious in diode lasers, as diode lasers generate a large amount of heat both in the laser-active pn-junction area as well as in the neighboring p- and n-conducting regions of the semiconductor body through which the current is supplied. In principle, the specific load at the pn-junction cannot be reduced below a certain minimum value, as this value is necessary for exceeding the excitation energy threshold. The threshold is exceeded when the stimulated emission outweighs absorption, that is, when the laser effect occurs.

In order to prevent damage to the pn-junction by excessive heating, various cooling methods have been proposed. Generally, in such arrangements the semiconducting body is connected to a heat sink which in turn may be water cooled. It is essential in order to obtain sufficient cooling, that the heat transfer be very effective at the contact surface between the devices. This aim is not however readily attainable. In these devices a substantial amount of heat tends to build up.

It is therefore the primary object of this invention to provide a laser-active semiconductor device in which the thermal load conditions are closely controlled in a very substantially simplified manner.

It is another object of this invention to provide a laser-active semiconductor device in which the thermal conditions in the semiconducting body are controlled without the use of auxiliary, externally arranged, cooling devices.

It is a further object of this invention to provide a semiconducting body in which the pn-junction area and current supply regions leading thereto form only a part of the whole body so as to facilitate dissipation of thermal energy.

It is a further object of this invention to provide a luminescence type diode in which the pn-junction area and current supply region leading thereto are embedded in a relatively good heat conducting but electrically poorly conducting body.

It is another object of this invention to provide a semiconducting body of the type under consideration in which the reflecting end surfaces are metallic to improve the light output of the device.

For a better understanding of the present invention, together with other and further objects thereof, reference is had to the following description taken in connection with the accompanying drawings, and their scope will be pointed out in the appended claims.

In the drawings:

FIG. 1 is a fragmentary perspective view, partly diagrammatic, of the semiconducting body in accordance with this invention;

FIGS. 2 and 3 are views similar to FIG. 1 illustrating modified versions of the invention; and FIG. 4 is a cross-sectional side view of another modification of the basic invention showing metallic mirror reflectors.

The present invention is based upon the consideration that the device can be constructed of, and the foregoing objects attained by, an especially mono-crystalline pure semiconducting material 1 which exhibits only intrinsic conduction, or at least has a relatively high electrical resistivity, and in which the pn-junction, e.g. the junction between regions 2 and 8, together with the adjoining p- and n-conducting current supply regions 2 and 8 constitute only part of the entire body.

The laser-active pn-junction is that region in which electromagnetic radiation is generated and/or amplified by the recombination of carriers. The heat from the laser-active pn-junctions and from the adjoining current supply regions is immediately carried off by the surrounding parts of the semiconducting body without having to pass thermal contact barriers. With the exception of the above mentioned junction areas and current supply regions, this body consists only of intrinsic conducting, or at least in relation to the doped parts, relatively high-resistivity, semiconducting material. The latter should be at least one, preferably several magnitudes lower in conductance than the current supply regions. The materials falling within this category include, for purposes of definition, also the so called "semi-insulating" materials. The latter type of material denotes, conventionally, high resistivity semiconductor material. For instance attention is invited to an article by R. W. Haisty, et al., in the Journal of Physics and Chemistry of Solids, p. 829 et seq., 1962. In regard to the requirement of high resistivity, it is to be noted that the material has to conduct electric current so poorly that the shunt which it represents to the diode region in the body is negligible. Satisfying this condition has no significant effect upon the heat transfer away from the criitcal regions of the body. As compared to the area of the pn-junction and the current leads where the heat is generated, the body may be dimensioned comparatively as large as desired and especially in the form of a conventional heat sink. The body may also be cooled with liquid air or liquid helium.

For generating electromagnetic radiation in accordance with the LASER principle, it is essential to provide a resonator arrangement. An optical resonator requires reflector arrangements which face each other so as to cause the radiation to travel back and forth between them. Because semiconducting materials have in general a high dielectric constant, it is frequently sufficient, in order to establish a reflector arrangement, to employ sufficiently flat and parallel-arranged surfaces of the semiconductor body, especially by using for instance crystalline planes of certain orientations.

Turning now more specifically to FIGURE 1, there is shown a segment of a small relatively thin plate of only intrinsically conducting, semiconducting material with high electric resistivity which forms the main body 1 of the device. The thickness of the body is, in the exemplary form, in the order of 1 mm.

The material for forming the body 1 must, of course, be capable of emitting radiation. Such materials are those normally used for manufacturing so-called luminescent or phosphorescent diodes particularly those in which band-to-band transitions occur. The preferred materials are gallium arsenide (GaAs) in particular and those belonging to the group $A_{III}B_{V}$, such as GaSb, InAs, InP and InSb, as well as mixed crystals thereof.

In the body 1, a plurality of pn-junction areas are created, typical regions being aforementioned 2 and 8, by doping on exactly oppositely facing surfaces of the body relatively narrow longitudinally elongated strips thus converted, into n- or p-conducting materials. The doping must penetrate the body sufficiently to allow the n-region and the p-region to come in contact to provide the pn-junction. The n-doped and p-doped regions, e.g. 2 and 8 respectively, between the junction zone and the respective outer surface of the body constiutes the current supply region. The remainder of the semiconducting body is electrically insualted from the dope regions, except for necessary electrical connections forcing the current to flow through the pn-junction and to produce radiation in accordance with the laser principle or the principle of a luminescent diode.

In the preferred embodiment along the doped strip the doping is interrupted and thus has spaced pn-junction areas composed of three n-regions 2, 3 and 4 with the corresponding number of oppositely arranged p-regions 8, 9 and 10. The axes of elongation of the junction zones, e.g. 4–10, 3–9 and 2–8, are substantially axially aligned. The resutling pn-junctions of regions 2–8, 3–9 and 4–10 are co-planar and suitably spaced from one another with portions of body 1 being interposed therebetween.

The axial ends of the resulting junction may also be provided with at least partially reflecting surfaces. In this case, the radiation travels from one reflector plane to the other, proceeding alternately through an amplifying pn-junction zone and the non-amplifying body material. It is to be noted that this arrangement does not have the drawback often present in other arrangements in which the light has to pass through optical contacts whereby its intensity, and ultimately the radiation output, is reduced. Herein practically no additional optical confining plane is formed in the radiation path. The radiation as a whole is reflected and travels between polished end surfaces 21 and 22 of the semiconductor body, arranged perpendicular to the junction interface and is partially emitted as radiation along a beam identified by arrows 16 and 17. At low levels of electrical excitation the diode operates as an incoherent source of radiation while at higher levels a coherent beam is emitted.

By spacing the doped regions in the main body 1, the heat generating areas are integrally connected to and form part of the device as a whole. The non-amplifying or inactive material between each pn-zone has at the most an insignificant absorption effect upon the radiation output. It is important to note that even though the cooling effect is increased, no loss of optical radiation occurs and thus the threshold current density does not have to be increased.

In accordance with this invention, it is also feasible to provide in one and the same semiconductor body 1 a plurality of parallel extending p- and n-doped strips in which individual junction zones co-act in a predetermined manner to produce radiation. There is shown in FIGURE 1 a second discontinuous array of serially disposed pn-junction zones 5–11; 6–12 and 7–13. They are established by doping, as above described, and arranged parallel to function zones 2–8, 3–9 and 4–10 and again electrically insulated from each other by the high resistivity portions of body 1. The regions 5, 6 and 7 may be n-conductive with regions 11, 12 and 13 p-conductive or reversely, p- and n-conductive, for the mode of connection to an energizing source shown in FIG. 1. The coherent radiation is emitted along beam 18 and 19.

The current required to establish inversion of the energy states is, preferably, caused to flow in a direction perpendicular to the plane of the junction zones. The regions 2 to 13 may be electrically connected in a variety of ways to conform to the requirements of the desired application. It is readily apparent that it is not necessary that the regions, for instance 2 and 3 or 2, 3 and 4 as a whole, together with regions 5, 6 and 7 be identically doped. It is possible, for instance, to dope the regions 5, 6 and 7 opposite to regions 2, 3 and 4, and thus the electric connections of the regions 11, 12 and 13 to the regions 8, 9 and 10 by way of the conductors 23, 24 and 25 establish a serial arrangement of the pn-junctions, provided current supply source 26 is coupled over lead conductor 27 to regions 5, 6 and 7 and by way of lead conductor 28 to the regions 2, 3 and 4.

The electrical connection to the current supply n- or p-conductive regions may be accomplished by depositing a metal upon the body. The lead or cable is then connected to the metallic deposit. For this purpose any suitable metal may be used which is sufficiently conductive and capable of forming a continuous layer on the semiconductor. Alternatively, the desired electrical connection between the pn-junction zones can be established by extending and/or interconnecting the current supply regions.

For a semiconductor body, for example, constructed of gallium arsenide (GaAs), the current source 26 is preferably poled in a manner to permit the diodes to be connected in the direction of current flow.

The specific system of FIG. 1, as above described, in which the body 1 is, for instance, composed of gallium arsenide, requires about 6 volts for energizing the series connected diode arrangement.

With regard to the electrical connections of the pn-junction zones and the current carrying regions thereof, it should be noted that, depending upon whether the source of electrical energy is a high-voltage or a high-current generator, individual radiation emitting zones of pn-junction are connected in series or parallel. The voltage requirements for one diode is in the order of several volts. The current required depends upon the previously mentioned excitation-energy threshold, the area of the pn-junction and, of course, on the output of radiation desired. For instance with, or as a substitute for, a light, such as a red automobile tail light, energized by a battery with 6 or 12 volts, a semiconducting device may be used, which has two or four identical pn-junction zones connected in series to the current supply. The same applies for several of such groups except that they must be first placed in parallel to one another.

The use of laser diodes in lieu of colored signal lights has many advantages, since the diodes, as radiation sources, are highly efficient in generating light and, specifically, monochromatic light.

Another specifically arranged system may be used, for instance, for operating on an A.C. line. A number of diodes, depending upon the voltage, are connected in series and alternately poled oppositely. In such an arrangement every other diode acts in a respective half-cycle of the alternating current as an emitting diode, the current passing therethrough in the forward bias direciton. The intermediate diodes, of opposite polarity, act as capacitive resistor or as tunnel diodes, depending upon the way the diode is doped. For the other half-cycle, the duties are reversed.

FIG. 2 illustrates a modification of the above described invention. On a thin plate of already suitably doped, preferably mono-crystalline, semiconducting material 41, is formed by epitaxial deposition a layer 42 of intrinsic conducting or at least high resistivity semiconducting material. Specific regions, e.g. 44 of the layer 42 are doped in the conventional manner to provide a pn-junction at the interface between such regions and the thin plate 41. Such region 44 is either a continuous strip as shown, or discontinuous, i.e. it is divided into a plurality of small sections, see 2, 3 and 4 of FIG. 1. Additional regions, e.g. 45, are established as required.

The regions 44 and 45 are electrically connected by electrode or jumper lead 46 extending transversely therebetween and lead 47 to the current source 49, to which also the layer 41 is connected by a lead 48.

In such embodiments it is again possible to provide a pn-junction zone and current supply regions pertaining thereto which occupy merely part of the whole body. This approach has the advantage of producing a semiconductor body whose pn-junctions are particularly well aligned in one plane. One must carefully proceed however in preparing the surface of plate 41 on which the epitaxial deposition takes place and also in doping the conductive regions.

A very flat and planar construction of the pn-junction is desirable as it improves the conditions for establishing the laser effect in the junction layer. As an alternative to deposition of only intrinsic conductive semiconducting material upon the doped plate, the reverse is also possible. That is to say, that suitably doped semiconductor material is deposited upon only intrinsic conducting semiconductor base layer or plate. In such embodiment the regions 44 and 45 are produced by doping appropriate portions of the base layer. An important consideration herein is to limit the total width of the regions (e.g. 44, 45) so that the pn-junction area constitutes only a part of the interface formed by layers 41, 42. This restriction makes it possible for the remaining portion of the layers to transfer heat from current conducting areas without conducting current therein. Thus in FIG. 2, as well as in FIGS. 1 and 3, wherein relative areas may be seen, it may be observed that, as measured in the plane through the active junction zones, the area or section of the surrounding high resistivity material is shown markedly larger than the active junction zone area.

FIGURE 3 illustrates another modification of this invention. Herein the intrinsic conducting or at least high resistivity layer 62 is embedded as an interlayer in a semiconducting body 61 consisting of areas 63 and 64 which are either n- or p-doped respectively. In layer 62 certain regions are doped either p- or n-type, in the above described manner, see elongated strips 65 and 66, to match either conductivity type of layer 63 or 64 to establish pn-junction zones lying in the same plane. The doped areas are electrically connected to the current source 49 by leads 67 and 68. The semiconductor body 61 may also be produced by epitaxial deposition of layers 62, 63 and 64. In such case it is appropriate to dope the region of the strips 65 and 66 at the time the layers are being formed.

In another modification of the embodiment shown in FIGS. 2–3, the intrinsic or high electrical resistivity material is epitaxially deposited upon a base layer which is also composed of high resistivity semi-conducting material. Suitable localized portions of each layer are doped to establish the pn-junctions and correspondingly adjoining p- and n-current conducting regions.

FIG. 4 shows another modifications of the invention which is particularly effective to provide an extraordinarily efficient semiconductor laser arrangement. Heretofore it has been practically impossible to substitute metallic mirrors for the polished end planes or reflecting surfaces of the semiconductor body. This is attributable to the fact that a metallic mirror disposed in a plane perpendicular to the plane of the pn-junction short-circuits the latter. However, the reflecting capacity of metallic mirrors is quite substantially higher than that of the polished end planes of the semiconductor body. Hence such substitution affords a significant reduction of the losses that are normally incurred by semiconductor laser elements of the prior art.

This construction is achieved in a semiconductor body 71 having an n-doped region 72 and in oppositely facing p-doped region 73 with pn-junction 74 being formed therebetween. The outer end faces of body 71 are polished and mounted thereon are metallic reflecting planes 75 and 76. The reflecting planes are again parallel to each other and perpendicular to the plane of, and spaced from the edges of, the pn-junction; the result being that radiation 77 generated along the plane of pn-junction 74 is caused to rebound between the reflecting planes 75 and 76. The latter forms the resonator necessary for generating stimulated emission radiation. A short circuit between n- and p-regions 72 and 73 by the metallic reflector planes cannot occur by virtue of the high resistivity of the intervening undoped end portions of the body 71. The n- and p-conducting regions are excited by way of leads 78 and 79 respectively. The arrows 80 and 81 represent that part of the radiation which is emitted through the reflecting planes.

It is to be understood that high electrical resistivity can be achieved by using a semiconducting material which exhibits only intrinsic conduction.

While there have been described what are at present considered to be the preferred embodiments of this invention, it will be obvious to those skilled in the art that the various embodiments and details thereof above described may be combined in numerous ways to obtain certain results and, further, various changes and modifications may be made therein without departing from the invention, and it is therefore, the intent of the appended claims to cover all such changes and modifications as fall within the true spirit and scope of the invention.

What is claimed is:

1. A semiconductor laser device including at least one laser-active pn-junction zone for emitting coherent radiation, comprising, as a unitary body of semiconductor material, p- and n-conducting current supply regions forming in a plane therebetween a said junction zone, and a region of semiconductor material having an electrical resistivity relatively high with respect to the resistivity of said supply regions, the high resistivity region being physically continuous with at least an extended part of each of the current supply regions and of the laser-active junction zone whereby laser operation generated heat may, without passing through any thermal barrier, reach the high resistivity material as an integral heat dissipating region, the area of said heat dissipating region, measured in said plane, being larger than that of said junction.

2. A semiconductor device as described in claim 1, including a second said region of high resistivity material spaced from the first said region of high resistivity material, the said first and second regions each providing a respective body end face perpendicular to the plane of and spaced from said junction zone, said end faces parallel to each other and having applied thereto metallic reflecting means forming an optically resonant cavity of the device.

3. A semiconductor device as described in claim 1 wherein all said regions comprise a material selected from the group $A_{III}B_V$ consisting of GaAs, GaSb, InAs, InP, InSb and mixed crystals thereof.

4. A semiconductor device as described in claim 1 comprising a plurality of said active junction zones and physically continuous therewith intervening separating regions of said material of high resistivity.

5. A semconductor device as described in claim 4, including conductor means joined to said current conductive regions and connecting at least two of said active zones electrically in series.

6. A semiconductor device as described in claim 4, including conductor means joined to said current conductive regions and connecting at least two of said active zones electrically in parallel.

7. A semiconductor device as described in claim 4, including conductor means joined to said current conductive regions, connecting a group of at least two said active zones in electrical parallelism in electrical series with at least one other active zone.

8. A semiconductor device as described in claim 1, comprising a plurality of said active junction zones, said zones elongated with lengths physically parallel to each other and physically continuous with intervening separating regions of said material of high resistivity.

9. A semiconductor device as described in claim 1, comprising a plurality of said active junction zones, said zones elongated and longitudinally aligned and physically continuous with intervening separating regions of said material of high resistivity.

10. A semiconductor device as described in claim 1, comprising a plurality of said active junction zones, including at least two said zones in longitudinal alignment and at least a third said zone parallel to the aligned zones, said region of semi-conductor material of electrical high resistivity physically continuous with an extended part of each of the current supply regions and junction zones of all of said plurality.

11. A semiconductor device as described in claim 10, herein said active zones are successively connected in said series with alternatingly reversed polarity whereby the several active junctions in the device may be operatively energized from an alternating current source.

12. A semiconductor laser device as described in claim 1, wherein said semiconductor material of high resistivity is a semi-insulator.

13. A semiconductor laser device as described in claim 1, wherein the said high resistivity region extends along at least one edge of the said pn-junction zone as a first high resistivity region, and the device includes a second region of semiconductor material having an electrical resistivity relatively high with respect to the resistivity of said supply regions, the second high resistivity region extending along at least a second edge of the said pn-junction zone and also being physically continuous with at least an extended part of each of the current supply with at least an extended part of each of the current supply regions and of the laser-active junction zone.

14. A method for producing a semiconductor laser device, comprising: providing an elongated sheet-like body composed of semiconductor material having relatively high electrical resistivity; and doping only portions of said body by penetrating the body with doping material from opposite surfaces, deeply enough to establish an n-conducting region and a p-conducting region meeting with each other to establish a pn-junction, thereby leaving undoped body portions to serve as integral heat sinks physically continuous with the n-conducting region, with the p-conducting region and with the junction.

15. A method for producing a semiconductor laser device, comprising: forming a composite body by epitaxially depositing a layer of semiconductor material having relatively high electrical resistivity upon a semiconductor material doped, at least in part, p-conductive and n-doping a localized portion of said layer to establish at least one substantially planar active pn-junction and associated p- and n-current conducting regions, thereby leaving undoped portions of said layer to serve as heat dissipating regions physically continuous with the n-conducting region, with the p-conducting region, and with the junction.

16. A method for producing a semiconductor laser device, comprising: forming a composite body by epitaxially depositing a layer of semiconductor material having relatively high electrical resistivity upon a semiconductor material doped, at least in part, n-conductive, and p-doping a localized portion of said deposited layer to establish with the n-conductive part of said layer at least one planar active pn-junction and operatively associated p- and n-current conducting regions, thereby leaving undoped portions of said layer to serve as heat dissipating regions physically continuous with the n-conducting region, with the p-conducting region, and with the junction.

17. A method for producing a semiconductor laser device, comprising: epitaxially depositing a layer of n-doped semiconductor material upon a body of intrinsic conductive or at least high resistivity semiconductor material, and doping a localized portion of the latter p-conducting to establish with the deposited layer at least one planar active pn-junction, and an operatively associated p-current conducting region, thereby leaving undoped body portions to serve as integral heat sinks physically continuous with the n-conducting region, with the p-conducting region and with the junction.

18. A method for producing a semiconductor laser device, comprising: epitaxially depositing a layer of p-doped semiconductor material upon a body of intrinsic conductive or at least high resistivity semiconductor material, and doping a localized portion of the latter n-conducting to establish with the deposited layer at least one planar active pn-junction and an operatively associated n-current conducting region, thereby leaving undoped body portions to serve as integral heat sinks physically continuous with the n-conducting region, with the p-conducting region and with the junction.

19. A method for producing a semiconductor laser device, comprising: forming a composite body by epitaxially depositing a layer of semiconducting material having intrinsic conductivity or at least relatively high electrical resistivity upon a semiconductor material having also a relatively high electrical resistivity, and doping respective localized portions of said body to establish a plurality of planar active pn-junctions with operatively associated p- and n-current conducting regions, and with said junctions substantially coplanar, thereby leaving undoped body portions to serve as integral heat sinks physically continuous with the n-conducting region, with the p-conducting region and with the junction.

References Cited

UNITED STATES PATENTS

| | | | |
|---|---|---|---|
| 3,239,688 | 3/1966 | Price | 331—94.5 |
| 3,245,002 | 4/1966 | Hall | 331—94.5 |
| 3,257,626 | 6/1966 | Marinace et al. | 331—94.5 |
| 3,354,406 | 11/1967 | Kiss | 331—94.5 |
| 3,303,432 | 2/1967 | Garfinkel et al. | 331—94.5 |

RONALD L. WIBERT, Primary Examiner

W. L. SIKES, Assistant Examiner

U.S. Cl. X.R.

300—312